United States Patent
Huang et al.

(10) Patent No.: US 10,630,049 B2
(45) Date of Patent: *Apr. 21, 2020

(54) COATING PROCESS FOR LASER HEAT SINKS

(71) Applicants: Robin Huang, North Billerica, MA (US); Bien Chann, Merrimack, NH (US); Parviz Tayebati, Sherborn, MA (US)

(72) Inventors: Robin Huang, North Billerica, MA (US); Bien Chann, Merrimack, NH (US); Parviz Tayebati, Sherborn, MA (US)

(73) Assignee: TERADIODE, INC., Wilmington, MA (US)

(*) Notice: Subject to any disclaimer, the term of this patent is extended or adjusted under 35 U.S.C. 154(b) by 78 days.

This patent is subject to a terminal disclaimer.

(21) Appl. No.: 15/785,557

(22) Filed: Oct. 17, 2017

(65) Prior Publication Data

US 2018/0041004 A1 Feb. 8, 2018

Related U.S. Application Data

(63) Continuation of application No. 15/271,773, filed on Sep. 21, 2016, now Pat. No. 9,825,428.

(60) Provisional application No. 62/232,651, filed on Sep. 25, 2015.

(51) Int. Cl.
*H01S 5/024* (2006.01)
*C23C 16/455* (2006.01)
*H01S 5/40* (2006.01)
*C23C 16/458* (2006.01)

(52) U.S. Cl.
CPC ...... *H01S 5/02423* (2013.01); *C23C 16/4583* (2013.01); *C23C 16/45555* (2013.01); *H01S 5/4025* (2013.01)

(58) Field of Classification Search
None
See application file for complete search history.

(56) References Cited

U.S. PATENT DOCUMENTS

| | | | |
|---|---|---|---|
| 9,825,428 B2* | 11/2017 | Huang | H01S 5/4025 |
| 2006/0203866 A1* | 9/2006 | Stephens, IV | H01S 5/02423 372/43.01 |
| 2011/0303404 A1* | 12/2011 | Tea | C23C 16/45555 165/180 |
| 2016/0076148 A1* | 3/2016 | Malinen | C23C 16/045 427/237 |
| 2017/0093121 A1 | 3/2017 | Huang et al. | |

* cited by examiner

Primary Examiner — Seahvosh Nikmanesh
Assistant Examiner — Xiaoming Liu
(74) Attorney, Agent, or Firm — Morgan, Lewis & Bockius LLP (57) ABSTRACT

In various embodiments, passivation layers are deposited on internal surfaces of cooling channels defined within heat sinks for electronic devices such as laser beam emitters, the passivation layers retarding or substantially preventing erosion and/or corrosion of the heat sinks.

17 Claims, 4 Drawing Sheets

COATING PROCESS FOR LASER HEAT SINKS

RELATED APPLICATIONS

This application is a continuation of U.S. patent application Ser. No. 15/271,773, filed Sep. 21, 2016, which claims the benefit of and priority to U.S. Provisional Patent Application No. 62/232,651, filed Sep. 25, 2015, the entire disclosure of each of which is hereby incorporated herein by reference.

TECHNICAL FIELD

In various embodiments, the present invention relates to the coating of interior surfaces of laser heat sinks for improved resistance to erosion and/or corrosion.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). (BPP values disclosed herein are in units of mm-mrad unless otherwise indicated.) A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Laser emitters in high-power laser systems are often solid-state (e.g., semiconductor-based) and may be configured for the emission of multiple beams and operation at high currents. Such emitters, e.g., diode bars and stacks, may therefore generate large amounts of heat during operation, and this heat must be channeled away from the emitters for optimum performance and to prevent emitter damage. Many different types of coolers and heat sinks have been developed to assist the cooling of high-power laser devices. For example, copper-based microchannel coolers and related heat sinks (including micro-impingement coolers) have very low thermal resistance for minimizing the junction temperature of diode and semiconductor laser emitters and laser bars. Thermal resistance values for state-of-the-art active heat sinks are as low as 0.02 K-cm$^2$/W, allowing for over 300 W continuous wave (CW) output power from diode laser bars.

The primary drawback of these active (i.e., utilizing directed fluid flow) heat sinks is limited reliability and lifetime. State-of-the-art active heat sinks have lifetime in the range of 10,000 to 20,000 hours of continuous operation. One of the key limitations of heat sink lifetime is erosion-corrosion resistance. Under typical water pressure and flow-rate conditions, standard copper microchannel coolers tend to show erosion and corrosion in their internal micro-structure. Thus, there is a need for techniques and configurations that enhance the reliability and lifetime of heat sinks for laser emitters and laser bars.

SUMMARY

In accordance with various embodiments of the present invention, thin-film deposition is performed to enhance the corrosion/erosion resistance of heat sinks for laser beam emitters. As utilized herein, the term "heat sink" refers to a device or apparatus that transfers the heat generated by the beam emitter to a fluid medium such as air or a cooling liquid, where it is dissipated away from the beam emitter, thereby maintaining the operating temperature of the beam emitter within safe levels. For example, heat sinks in accordance with embodiments of the present invention include microchannel coolers, micro-impingement coolers, macro-channel coolers, direct-bonded-copper coolers, and other heat sinks that channel air and/or a cooling fluid (e.g., a cooling liquid) thereon or therethrough for heat dissipation. The heat sinks may include, consist essentially of, or consist of copper or another thermally conductive material (e.g., aluminum, alloys including, consisting essentially of, or consisting of copper and/or aluminum with one or more other elements, etc.). Pursuant to embodiments of the invention, a thin protective film is deposited on the interior surfaces (i.e., those surfaces that come into contact with cooling fluid during use) of multiple heat sinks at the same time. In this manner, even slow, lower-throughput deposition processes may be utilized to improve heat sink performance in a process suited to high-volume manufacturing. The protective film may include, consist essentially of, or consist of $TiO_2$, $SiO_2$, $Al_2O_3$, and/or other materials providing protection against erosion and/or corrosion due to exposure of a flowing heat-exchange (or "cooling") fluid such as water.

In various embodiments of the invention, multiple heat sinks are fastened together in a "vertical" stack configuration or assembly and a thin protective film is deposited on one or more surfaces (e.g., internal surfaces) of the heat sinks during the same deposition sequence. Spacers such as o-rings or gaskets may be disposed between the heat sinks, and top and bottom covers and/or manifolds may be placed the top and bottom of the stack of heat sinks. In other embodiments, multiple heat sinks are placed in a "horizontal" configuration in which the heat sinks are singly attached to a common manifold for the thin-film deposition. In either configuration, multiple heat sinks may be advantageously coated in the same deposition sequence.

Various embodiments of the present invention utilize atomic layer deposition (ALD) to deposit the thin protective films on internal (and, in some embodiments, external) surfaces of heat sinks. ALD is a thin film deposition method in which a film is grown on a sample substrate surface by subjecting it to alternating pulses of gaseous precursors. ALD is a self-limiting process, so layers may be deposited atomic layer by atomic layer. Furthermore, the ALD process allows for a very conformal deposition on a surface with a lot of topology. Many materials may be deposited by ALD. However, one drawback to the ALD process is that it can be very slow and time consuming, since the deposition proceeds one atomic layer at a time. Furthermore, there can be limitations on the size of a standard ALD deposition chamber, which may limit the utility of ALD for high-volume production when coating larger parts.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams.

Laser emitters equipped with heat sinks produced in accordance with embodiments of the invention may be utilized with wavelength beam combining (WBC) systems that include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998. U.S. Pat. No. 8,670,180, filed on Aug. 25, 2011, and U.S. Pat. No. 8,559,107, filed on Mar. 7, 2011, the entire disclosure of each of which is incorporated by reference herein.

In an aspect, embodiments or the invention feature a method of heat sink preparation. A plurality of heat sinks is provided. Each heat sink defines an aperture fluidly connected to one or more hollow cooling channels defined within the heat sink. Each cooling channel has an internal surface. A bottom manifold is provided. The bottom manifold has an internal passage fluidly connected to (i) a gas inlet, (ii) a gas outlet, and (iii) a plurality of openings. A first surface of each heat sink is sealed against the bottom manifold such that the aperture of each heat sink is aligned with one of the openings. One or more gaseous precursors are flowed through the gas inlet, into each of the heat sinks, and out of the gas outlet to thereby form a coating on the internal surface of the one or more cooling channels of each heat sink.

Embodiments of the invention may include one or more of the following in any of a variety of combinations. At least two gaseous precursors may be flowed to form the coating. The gaseous precursors may be flowed sequentially or substantially simultaneously. The coating may include, consist essentially of, or consist of $TiO_2$, $SiO_2$, and/or $Al_2O_3$. The aperture of at least one of the heat sinks may extend through the entire thickness of the heat sink. Before flowing the precursors, a second surface opposite the first surface of one or more of the heat sinks may be sealed with a top manifold. The top manifold may be sealed to a plurality of heat sinks. A different, discrete top manifold may be sealed to each of the heat sinks. Sealing the first surface of each heat sink against the bottom manifold may include, consist essentially of, or consist of disposing an o-ring and/or a gasket therebetween. One or more flow parameters may be sensed (e.g., by one or more sensors) proximate, on, and/or in the gas outlet and/or the gas inlet. A deposition parameter may be controlled based at least on the sensed deposition parameter(s). The flow parameter(s) may include, consist essentially of, or consist of a flow rate and/or a composition of at least one of the precursors (e.g., one or more by-products of the precursors and/or the precursor after at least partial depletion via deposition). The deposition parameter may include, consist essentially of, or consist of (i) initiation of flow of at least one precursor, (ii) termination of flow of at least one precursor, (iii) flow rate of at least one precursor, and/or (iv) temperature applied to the heat sinks.

After formation of the coating, a beam emitter may be disposed on one of the heat sinks in thermal contact with at least one cooling channel defined therewithin. Power may be supplied to the beam emitter, whereby the beam emitter emits one or more laser beams. A cooling fluid may be flowed into the cooling channels defined within the heat sink, whereby the coating retards or substantially prevents corrosion and/or erosion of the heat sink. The beam emitter may include, consist essentially of, or consist of a diode bar configured to emit a plurality of laser beams.

In another aspect, embodiments of the invention feature a method of heat sink preparation. A plurality of heat sinks each defining two apertures are provided. Each aperture (i) has an internal surface, (ii) is fluidly connected to one or more hollow cooling channels defined within the heat sink, and (iii) extends through an entire thickness of the heat sink. Each cooling channel has an internal surface. A bottom manifold is provided. The bottom manifold has an internal passage fluidly connected to (i) a gas inlet, (ii) a gas outlet, and (iii) two openings. A first surface of a first heat sink is sealed against the bottom manifold such that each aperture of the first heat sink is aligned with a different one of the openings of the bottom manifold. One or more additional heat sinks are stacked over the first heat sink such that their apertures are aligned with the apertures of the first heat sink. Each heat sink is sealed to any heat sink thereabove and therebelow. A top manifold is provided. The top manifold has an internal passage fluidly connected to two openings. The top manifold is sealed over the stack of heat sinks such that each aperture of the topmost heat sink is aligned with a different one of the openings of the top manifold. One or more gaseous precursors are flowed through the gas inlet, into a first aperture of each of the heat sinks, through the top manifold, into a second aperture of each of the heat sinks, and out of the gas outlet to thereby form a coating on the internal surface of the one or more cooling channels of each heat sink.

Embodiments of the invention may include one or more of the following in any of a variety of combinations. At least two gaseous precursors may be flowed to form the coating. The gaseous precursors may be flowed sequentially or substantially simultaneously. The coating may include, consist essentially of, or consist of $TiO_2$, $SiO_2$, and/or $Al_2O_3$. Sealing the first surface of the first heat sink against the bottom manifold may include, consist essentially of, or consist of disposing an o-ring and/or a gasket therebetween. Stacking the one or more additional heat sinks over the first heat sink may include, consist essentially of, or consist of disposing an o-ring and/or a gasket between adjacent heat sinks. Sealing the top manifold over the stack of heat sinks may include, consist essentially of, or consist of disposing an o-ring and/or a gasket therebetween. One or more flow parameters may be sensed (e.g., by one or more sensors) proximate, n, and/or in the gas outlet and/or the gas inlet. A deposition parameter may be controlled based at least on the sensed deposition parameter(s). The flow parameter(s) may include, consist essentially of, or consist of a flow rate and/or a composition of at least one of the precursors (e.g., one or more by-products of the precursors and/or the precursor after at least partial depletion via deposition). The deposition parameter may include, consist essentially of, or consist of (i) initiation of flow of at least one precursor, (ii) termination of flow of at least one precursor, (iii) flow rate of at least one precursor, and/or (iv) temperature applied to the heat sinks.

After formation of the coating, a beam emitter may be disposed on one of the heat sinks in thermal contact with at least one cooling channel defined therewithin. Power may be supplied to the beam emitter, whereby the beam emitter emits one or more laser beams. A cooling fluid may be flowed into the cooling channels defined within the heat sink, whereby the coating retards or substantially prevents corrosion and/or erosion of the heat sink. The beam emitter may include, consist essentially of, or consist of a diode bar configured to emit a plurality of laser beams.

In yet another aspect, embodiments of the invention feature a heat sink resistant to corrosion and/or erosion. The heat sink includes, consists essentially of, or consists of a body, a fluid inlet, a fluid outlet, and a protective layer. The body includes, consists essentially of, or consists of a thermally conductive material. The body defines one or more hollow cooling channels therewithin. The fluid inlet conducts cooling fluid into the one or more cooling channels. The fluid outlet conducts cooling fluid out of the one or more cooling channels, whereby heat is dissipated from the body via flow of cooling fluid through the one or more cooling channels. The protective layer is disposed on an internal surface of at least one of the cooling channels. The protective layer retards or substantially prevents corrosion and/or erosion by the cooling fluid.

Embodiments of the invention may include one or more of the following in any of a variety of combinations. The fluid inlet and the fluid outlet may be portions or the entirety of the same aperture. The fluid inlet and the fluid outlet may be separate apertures defined within the body. The protective layer may be disposed on an internal surface of the fluid inlet and/or the fluid outlet. The thermally conductive material may include, consist essentially of, or consist of copper and/or aluminum and/or an alloy of copper and/or aluminum with one or more other elements. The protective layer may include, consist essentially of, or consist of $TiO_2$, $SiO_2$, and/or $Al_2O_3$. A top surface of the body may define a platform for receiving a beam emitter thereon. The platform may be in thermal contact with one or more of the cooling channels. A beam emitter may be disposed on the platform, whereby heat generated by the beam emitter is dissipated by cooling fluid flowing through the one or more cooling channels. The beam emitter may include, consist essentially of, or consist of a diode bar configured to emit a plurality of laser beams. The body of the heat sink may include, consist essentially of, or consist of a plurality of discrete layers, portions of the layers being shaped to define the one or more cooling channels. The layers may be bonded together (e.g., diffusion bonded and/or via an adhesive or a joining agent such as solder) to form the body.

In another aspect, embodiments of the invention feature a wavelength beam combining laser system that includes, consists essentially of, or consists of a beam emitter, focusing optics, a dispersive element, a partially reflective output coupler, and a heat sink thermally connected to the beam emitter (i.e., in sufficient proximity such that at least some of the heat generated by the beam emitter during operation is conducted away from the beam emitter through at least a portion of the heat sink). The beam emitter emits a plurality of discrete beams (e.g., laser beams) and may have first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam or into an optical fiber) as a multi-wavelength output beam, and reflect a second portion of the dispersed beams back toward the dispersive element. The heat sink includes, consists essentially of, or consists or a body, a fluid inlet, a fluid outlet, and a protective layer. The body includes, consists essentially of, or consists of a thermally conductive material. The body defines one or more hollow cooling channels therewithin. The fluid inlet conducts cooling fluid into the one or more cooling channels. The fluid outlet conducts cooling fluid out of the one or more cooling channels, whereby heat is dissipated from the body via flow of cooling fluid through the one or more cooling channels. The protective layer is disposed on an internal surface of at least one of the cooling channels. The protective layer retards or substantially prevents corrosion and/or erosion by the cooling fluid.

Embodiments of the invention may include one or more of the following in any of a variety of combinations. The dispersive element may include, consist essentially of, or consist of a diffraction grating (e.g., a reflective diffraction grating or a transmissive diffraction grating). The fluid inlet and the fluid outlet may be portions or the entirety of the same aperture. The fluid inlet and the fluid outlet may be separate apertures defined within the body. The protective layer may be disposed on an internal surface of the fluid inlet and/or the fluid outlet. The thermally conductive material may include, consist essentially of, or consist of copper and/or aluminum and/or an alloy of copper and/or aluminum with one or more other elements. The protective layer may include, consist essentially of, or consist of $TiO_2$, $SiO_2$, and/or $Al_2O_3$. A top surface of the body may define a platform for receiving a beam emitter thereon. The platform may be in thermal contact with one or more of the cooling channels. A beam emitter may be disposed on the platform, whereby heat generated by the beam emitter is dissipated by cooling fluid flowing through the one or more cooling channels. The beam emitter may include, consist essentially of, or consist of one or more diode bars each configured to emit a plurality of laser beams. The body of the heat sink may include, consist essentially of, or consist of a plurality of discrete layers, portions of the layers being shaped to define the one or more cooling channels. The layers may be bonded together (e.g., diffusion bonded and/or via an adhesive or a joining agent such as solder) to form the body.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means 110%, and in some embodiments, 15%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
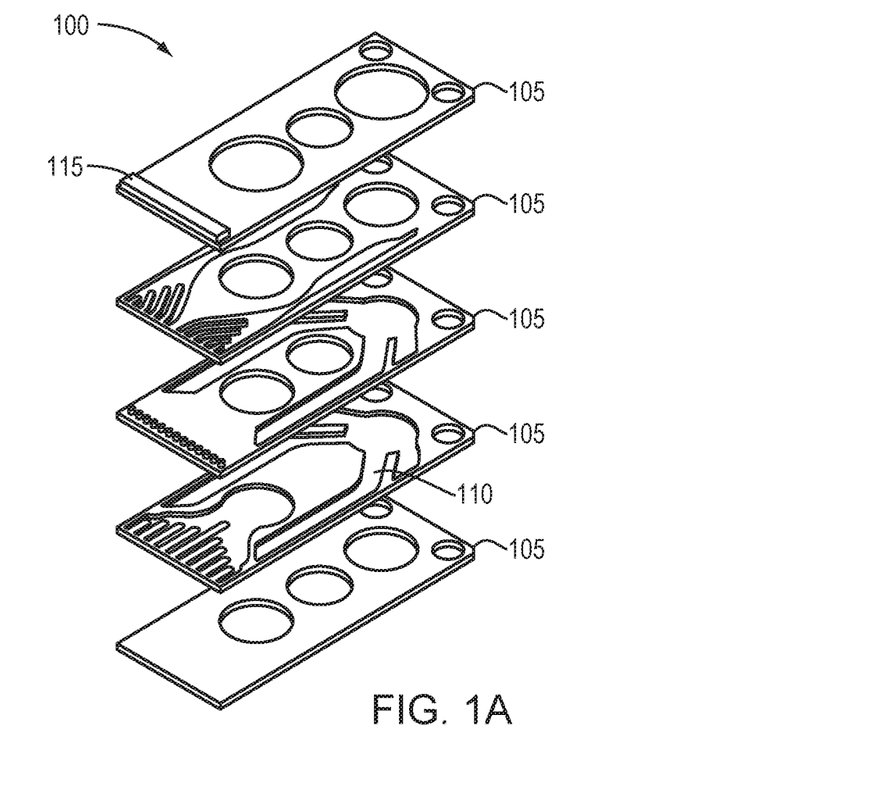
FIG. 1A is an exploded schematic diagram of a heat sink in accordance with various embodiments of the invention.
Figure 1B:
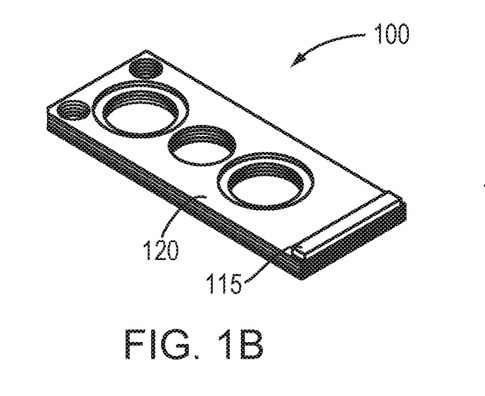
FIG. 1B is a perspective top view of the heat sink of FIG. 1A.
Figure 1C:
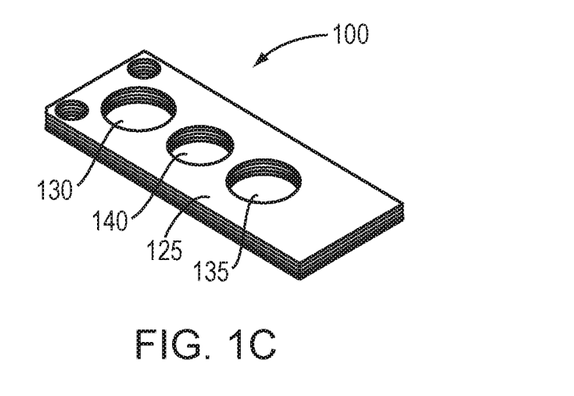
FIG. 1C is a perspective bottom view of the heat sink of FIG. 1A.

Embodiments of the present invention may be utilized with a host of different types of heat sinks. One example is a microchannel heat sink, e.g., as described in U.S. Pat. No. 7,656,915, filed on Jul. 26, 2006, the entire disclosure of which is incorporated by reference herein. FIGS. 1A-1C depict an exemplary microchannel heat sink 100 that may be utilized in embodiments of the present invention. As shown, the heat sink 100 is formed of several different layers 105 that are stacked together to form the heat sink. Two or more of the layers 105 may be shaped and/or cut so that the layers 105, which stacked together to form a unified whole, define channels 110 therewithin for the conduction of cooling fluid therein. In addition, the topmost layer 105 defines a platform thereon for positioning of a beam emitter 115; the cooling fluid flowing through the channels defined by layers 105 conducts heat away from the beam emitter 115, thereby ensuring that the temperature abeam emitter 115 is maintained within safe limits during operation. The beam emitter 115 may include or consist essentially of, e.g., a single-beam laser diode or a diode bar configured to emit multiple beams.

As shown in FIGS. 1B and 1C, once the layers 105 are assembled, the microchannel heat sink 100 has opposing top and bottom surfaces 120, 125, as well as a fluid inlet 130 and a fluid outlet 135. During operation, fluid is flowed from a fluid source (e.g., a reservoir or tank of cooling fluid), through the channels defined by layers 105, and out the fluid outlet 135. In addition, in embodiments of the invention the heat sink 100 may also define an alignment aperture 140 to facilitate alignment of multiple different heat sinks 100 when they are stacked together, e.g., in a laser system utilizing multiple beam emitters 115 in a stacked configuration. The heat sink 100 may include, consist essentially of, or consist of copper or another thermally conductive material (e.g., aluminum, alloys including, consisting essentially of, or consisting of copper and/or aluminum with one or more other elements, etc.). In various embodiments, the platform in the topmost layer 105 that receives the beam emitter 115 may be composed of the same material as the remaining portions of the heat sink 100, or it may include a layer or portion including, consisting essentially of, or consisting of another thermally conductive material such as diamond, gold, silver, platinum, AlN, etc. In must be emphasized that this particular configuration of heat sink 100 is merely exemplary, and embodiments of the invention may be applied to heat sinks having other configurations and/or surfaces exposed to a cooling fluid during operation.

Embodiments of the present invention passivate surfaces of heat sinks that are exposed to cooling fluid (e.g., internal surfaces, surfaces of internal fluid channels, etc.) in order to retard or substantially prevent corrosion and/or erosion of the heat sink. Once heat sinks like those depicted in FIGS. 1A-1C are assembled, such internal surfaces are difficult to access. In addition, fabrication oldie entirety of the heat sink from a corrosion-resistant and/or erosion-resistant material would diminish the thermal conductivity and thus efficacy of the heat sink, as such materials are typically not as thermally conductive as metals such as copper or aluminum (or alloys thereof). Thus, in accordance with embodiments of the invention, passivating thin films are deposited on surfaces of the heat sink that will be exposed to cooling fluid during operation. In addition, embodiments of the invention enable the coating of the surfaces of multiple heat sinks substantially simultaneously, thereby improving throughput and cost effectiveness.

Figure 2:
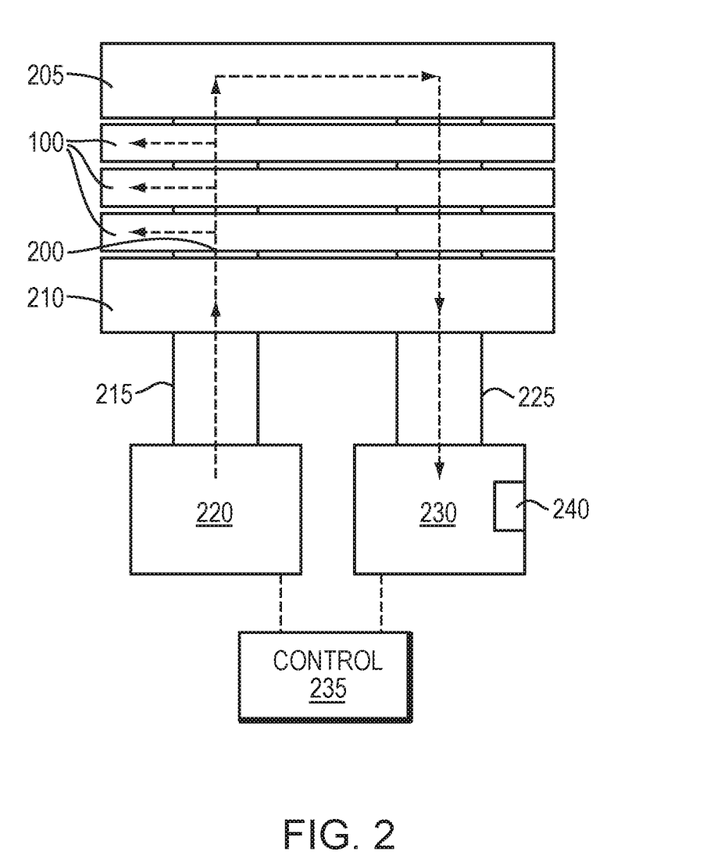
FIG. 2 is a schematic diagram of a deposition system for passivation of multiple heat sinks in accordance with various embodiments of the invention.

FIG. 2 depicts a side view of multiple heat sinks 100 in a vertical stack configuration in accordance with embodiments of the invention. In the depicted embodiments, the heat sinks 100 are stacked atop each other such that their fluid inlets and outlets are aligned with each other, thereby defining an open path that extends into and out of each of the heat sinks 100. In various embodiments, the heat sinks 100 are sealed together via o-rings or gaskets 200 such that the seals between the heat sinks are substantially fluid-tight. The assembled stack of heat sinks 100 is likewise sealed to a top manifold 205 that defines therewithin a conduit for fluid that extends from the fluid inlets oldie heat sinks 100 to their fluid outlets (or vice versa) but is otherwise sealed to prevent the escape of deposition material during processing (as detailed below). In addition, the stack of heat sinks 100 may be sealed to a bottom manifold 210 that defines therewithin conduits that are at least partially aligned with the fluid inlets and outlets of the heat sinks 100. A gas inlet port 215 extends from one or more deposition gas sources 220 to the bottom manifold 210, and a gas outlet port 225 extends from the bottom manifold 210 to an exhaust line 230. The entire assembly may be placed within a deposition chamber, but the chamber is optional in embodiments of the present invention due to the stacked assembly of heat sinks 100 and the other components being sealed together to prevent gas leakage therefrom.

In accordance with embodiments of the invention, as shown by the dashed arrows in FIG. 2, gaseous precursors (e.g., for an ALD process) are flowed into the stack of heat sinks 100 from the gas source 220 via the inlet port 215 and the bottom manifold 210. The precursor gas enters each heat sink 100 and deposits upon all exposed surfaces internal each heat sink 100. Advantageously, the surfaces of each heat sink 100 reached by the precursor gas at least substantially correspond to the surfaces that will be exposed to cooling fluid during operation of a laser source attached to one of the heat sinks 100 during subsequent operation. During deposition, the entire assembly may be heated to a suitable deposition chamber. As shown in FIG. 2, any unused precursor gas flows out of the stacked assembly of heat sinks 100 through the outlet port 225 and into the exhaust 230, where it may be safely disposed of or reclaimed for further depositions.

An exemplary passivating coating deposited in embodiments of the present invention is $TiO_2$, but many other coatings are possible. Coatings with multiple or laminate layers may also be utilized, such as $TiO_2/Al_2O_3$ multilayers. The gas flow rates and pressures may be adjusted to ensure uniform coverage of all interior surfaces. In various embodiments, for a particular thin-film, two or more gaseous precursors are introduced as a series of sequential, non-overlapping pulses. The first precursor interacts with the exposed internal surfaces of the heat sinks 100 until available surface sites are "consumed." Then, a different precursor is introduced to react with the first precursor, resulting in a thin (e.g., monolayer) film of the material to be deposited. For example, alternating introduction of trimethylaluminum (TMA) and water vapor or oxygen may be utilized to form an $Al_2O_3$ coating. The heat sinks to be coated may be at room temperature, or they may be heated to a temperature of, e.g., approximately 300° C., or even higher. Other combinations of precursors are known in the art and may be selected by one of skill in the art without undue experimentation. Although embodiments of the invention therefore utilize ALD for deposition on various surfaces of heat sinks 100, other gas-phase deposition techniques may also be used, e.g., chemical vapor deposition.

As shown in FIG. 2, the flow of the gaseous precursors may be controlled is a controller 235 that electronically controls the gas sources 220, as well as valves, conduits, etc. leading from the gas sources 220 to the heat sinks 100 in response to, e.g., user input or pre-programmed deposition sequences. The controller 235 may be provided as either software, hardware, or some combination thereof. For example, the system may be implemented on one or more conventional server-class computers, such as a PC having a CPU hoard containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PID), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In addition, embodiments of the invention may feature control of the flow rate and/or duration of the various gaseous precursors based on the consumption or lack thereof of the precursor gases within the heat sinks 100. For example, the controller 235 may control the initiation and termination of the precursor flow, as well as one or more deposition parameters, e.g., the flow rate, the flow duration, etc., in response to an amount or composition of the exhaust gas entering the exhaust 230. Specifically, one or more sensors 240 (e.g., chemical sensors, flow sensors, etc.) may be disposed proximate or in the exhaust 230 (and/or the inlet 215 or gas sources 220) to analyze the amount and/or composition of the exhaust gas. In various embodiments of the invention, when molecules of a precursor gas have been deposited on, and therefore occupy, all available deposition sites within the stack of heat sinks 100, the precursor gas will no longer be depleted (or not depleted as much) during its loop through the stacked heat sinks 100; thus, if a sensor 240 detects little variation in the composition and/or flow rate of the precursor gas between the gas inlet 215 and the outlet 225 (and/or exhaust 230), then the flow of that particular precursor gas may be stopped and flow of one or more subsequent precursors may be initiated.

In the configuration shown in FIG. 2, a large number of heat sinks 100 may be coated simultaneously, limited by the assembly time of the stack, for which standard manufacturing processes exist in the high power diode laser industry. In principle, dozens or hundreds of heat sinks 100 may readily be stacked and coated in accordance with embodiments of the invention. Although the gas inlet 215 and outlet 225 are depicted as being disposed on the same surface of the bottom manifold 210, the gas outlet 225 may be disposed on a different surface (e.g., the opposite surface or a side surface).

Figure 3:
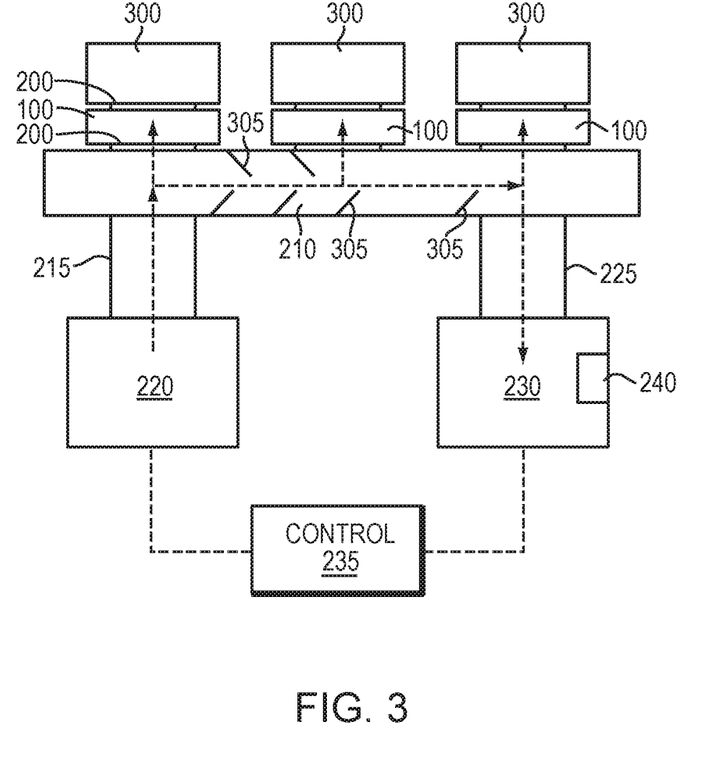
FIG. 3 is a schematic diagram of a deposition system for passivation of multiple heat sinks in accordance with various embodiments of the invention.

FIG. 3 depicts a side view of multiple heat sinks 100 in a parallel stacking configuration in accordance with embodiments of the invention. This configuration is similar to the ne shown in FIG. 2, except that the heat sinks 100 are placed side-by-side in a horizontal stack arrangement, instead of in a vertical stack arrangement. As shown, each heat sink 100 may be fluidly connected and seated to a bottom manifold 210 via, e.g., o-rings or gaskets 200, so that a fluidic path extends from the bottom manifold 210 into each of the heat sinks 100. In some embodiments, heat sinks 100 define therewithin a fluid path for cooling fluid that enters and exits the heat sink from the same surface, thus, in various embodiments no top manifold or cover need be disposed on a heat sink 100 (e.g., a standalone microimpingement cooler) to prevent escape of gaseous deposition precursors therefrom. In other embodiments, e.g., as shown in FIGS. 1A-1C, the fluidic path through the heat sink may include apertures that extend through the heat sink. Thus, in various embodiments, each heat sink 100 (or stack of multiple heat sinks) may have sealed thereto a top cover 300 that prevents the escape of precursor gases from the heat sink 100 during deposition. In other embodiments, a single top cover 300 may be utilized to seal more than one heat sink 100 (or stack thereof) disposed over the bottom manifold 210.

Once the multiple heat sinks 100 are disposed and sealed on the bottom manifold 210, deposition of the passivating layer may proceed substantially as described above. Although the gas inlet 215 and outlet 225 are depicted as being disposed on the same surface of the bottom manifold 210, the gas outlet 225 may be disposed on a different surface (e.g., the opposite surface or a side surface). In addition, the bottom manifold 210 may incorporate one or more internal baffles 305 or other internal structures that direct the gas flow into each of the parallel heat sinks 100. In this manner, the heat sinks 100 may be coated in a more efficient manner, as more gas flow is directed toward the heat sinks 100 and the amount of precursor gas flowing directly from the inlet 215 to the outlet 225 is reduced or minimized.

After deposition of the passivating layer in accordance with embodiments of the invention, the heat sinks 100 may be detached from the bottom manifold 210 (and each other, if necessary) and utilized for efficient cooling of a beam emitter 115. The beam emitter 115 may be disposed on the heat sink 100, and cooling fluid (e.g., water, deionized water, a glycol, etc.) may be flowed through the heat sink 100 to cool the beam emitter 115 during operation. The passivating layer deposited on the internal surfaces exposed to the cooling fluid retards or substantially prevents erosion and/or corrosion of such surfaces due to the cooling fluid, thereby increasing the useful lifespan of the heat sink 100 and the up-time of the beam emitter 115 and/or the laser system in which the beam emitter 115 is disposed.

Figure 4:
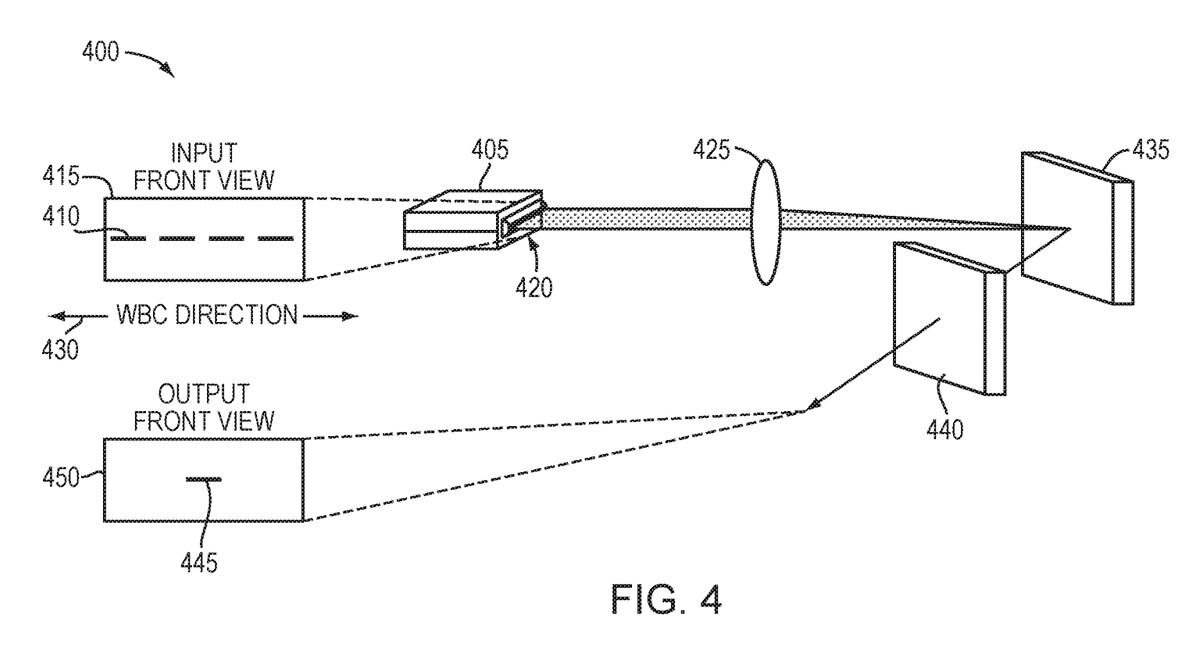
FIG. 4 is a schematic diagram of a wavelength beam combining laser system that may incorporate beam emitters integrated with or on heat sinks passivated in accordance with various embodiments of the invention.

Passivated heat sinks in accordance with embodiments of the present invention and detailed herein may be utilized in and/or with various types of high-power laser systems, e.g., WBC laser systems. Specifically, in various embodiments of the invention, passivated heat sinks may be utilized for cooling of input beam emitters in WBC laser systems. FIG. 4 depicts an exemplary WBC laser system 400 that utilizes one or more lasers 405 mounted on a heat sink passivated in accordance with embodiments of the present invention. In the example of FIG. 4, laser 405 features a diode bar having four beam emitters emitting beams 410 (see magnified input view 415), but embodiments of the invention may utilize diode bars emitting any number of individual beams or two-dimensional arrays or stacks of diodes or diode bars; each such beam emitter may be mounted on its own passivated heat sink, or multiple beam emitters may be mounted on a shared passivated heat sink in accordance with embodiments of the present invention. In view 415, each beam 410 is indicated by a line, where the length or longer dimension of the line represents the slow diverging dimension of the beam, and the height or shorter dimension represents the fast diverging dimension. A collimation optic 420 may be used to collimate each beam 410 along the fast dimension. Transform optic(s) 425, which may include or consist essentially of one or more cylindrical or spherical lenses and/or mirrors, are used to combine each beam 410 along a WBC direction 430. The transform optics 425 then overlap the combined beam onto a dispersive element 435 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 440. The output coupler 440 then transmits the combined beams 445 as shown on the output front view 450. The output coupler 440 is typically partially reflective and acts as a common front facet for all the laser elements in this external cavity system 400. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 445 is a thus a multiple-wavelength beam (combining the wavelengths of the individual beams 410), and may be utilized as the input beam for a laser beam delivery system and/or may be coupled into an optical fiber.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of preparing a plurality of heat sinks each configured to be separately placed in thermal contact with a different laser beam emitter for thermal management thereof, the method comprising:
   providing a plurality of heat sinks each defining a different aperture fluidly connected to one or more hollow cooling channels defined within the heat sink, each cooling channel having an internal surface;
   providing a bottom manifold having an internal passage fluidly connected to (i) a gas inlet, (ii) a gas outlet, and (iii) a plurality of different openings each different from the gas inlet and the gas outlet;
   sealing a first surface of each heat sink against the bottom manifold such that the aperture of each heat sink is aligned with a different one of the openings;
   flowing two or more gaseous precursors (a) through the gas inlet, (b) into each of the heat sinks through the aperture thereof, (c) back out of each of the heat sinks through the aperture thereof, and (d) out of the gas outlet to thereby form a coating on the internal surface of the one or more cooling channels of each heat sink; and
   separating each heat sink from the bottom manifold after formation of the coating.

2. The method of claim 1, wherein the bottom manifold defines or comprises therewithin one or more baffles configured to direct gas flowing within the internal passage of the bottom manifold.

3. The method of claim 2, wherein the one or more baffles comprises one or more different baffles associated with each of the openings in the bottom manifold.

4. The method of claim 1, further comprising, after separating each heat sink from the bottom manifold, placing each heat sink in thermal contact with a different laser beam emitter.

5. The method of claim 4, further comprising, after formation of the coating:
   supplying power to one of the laser beam emitters, whereby the laser beam emitter emits one or more laser beams; and
   flowing a cooling fluid into the one or more cooling channels defined within the heat sink in thermal contact with the laser beam emitter, whereby the coating retards or substantially prevents corrosion and/or erosion of the heat sink.

6. The method of claim 5, wherein the laser beam emitter comprises a diode bar configured to emit a plurality of laser beams.

7. The method of claim 1, wherein the coating comprises at least one of $TiO_2$, $SiO_2$, or $Al_2O_3$.

8. The method of claim 1, wherein the aperture of each of the heat sinks extends through the entire thickness of the heat sink, and further comprising, before flowing the precursors, sealing a second surface of each heat sink, opposite the first surface, with one or more top manifolds, and further comprising removing the one or more top manifolds from all of the heat sinks after formation of the coating.

9. The method of claim 8, wherein the one or more top manifolds is a single top manifold sealed to a plurality of heat sinks.

10. The method of claim 8, wherein (i) the one or more top manifolds comprises a plurality of top manifolds, and (ii) a different, discrete top manifold is sealed to each of the heat sinks.

11. The method of claim 1, wherein the gaseous precursors are flowed sequentially.

12. The method of claim 1, wherein sealing the first surface of each heat sink against the bottom manifold comprises disposing at least one of an o-ring or a gasket therebetween.

13. The method of claim 1, further comprising:

sensing a flow parameter proximate the gas outlet; and controlling a deposition parameter based at least on the sensed deposition parameter.

14. The method of claim 13, wherein the flow parameter comprises at least one of a flow rate or a composition of at least one of the precursors.

15. The method of claim 13, wherein the deposition parameter comprises at least one of (i) initiation of flow of at least one precursor, (ii) termination of flow of at least one precursor, (iii) flow rate of at least one precursor, or (iv) temperature applied to the heat sinks.

16. The method of claim 1, wherein each heat sink is formed of multiple discrete layers cooperatively defining the hollow cooling channels within the heat sink.

17. The method of claim 1, wherein a portion of each of the gaseous precursors flows through the gas inlet, through the bottom manifold, and out of the gas outlet without entering any of the heat sinks.

* * * * *